United States Patent [19]

Nekut

[11] 4,049,452

[45] Sept. 20, 1977

[54] REVERSE-PRINTING METHOD FOR PRODUCING CATHODE-RAY-TUBE-SCREEN STRUCTURE

[75] Inventor: Edith Mayaud Nekut, Lancaster, Pa.

[73] Assignee: RCA Corporation, New York, N.Y.

[21] Appl. No.: 570,618

[22] Filed: Apr. 23, 1975

[51] Int. Cl.$^2$ .............................................. B05D 3/06
[52] U.S. Cl. ........................................ 96/36.1; 96/93;
427/43; 427/54; 427/68
[58] Field of Search .................... 96/36.1, 93; 427/43, 427/54, 68

[56] References Cited

U.S. PATENT DOCUMENTS

| | | | |
|---|---|---|---|
| 2,916,376 | 12/1959 | Ritter et al. | 96/93 |
| 3,589,907 | 6/1971 | Dijkstra | 96/93 |
| 3,651,170 | 3/1972 | Silver | 96/93 |
| 3,877,948 | 4/1975 | Yonezawa et al. | 96/93 |

*Primary Examiner*—John H. Newsome
*Attorney, Agent, or Firm*—G. H. Bruestle; L. Greenspan

[57] ABSTRACT

In the method disclosed, a supporting surface, such as the inner surface of the faceplate of the tube, is coated with a photosensitive polymeric film containing about 5 to 80 weight percent of at least one member of the group consisting of certain diol ethers and diol alkanes. Then the film is exposed to a light image to produce regions of greater solubility and regions of lesser solubility. The film regions of greater solubility are removed, and then the entire faceplate with its regions of less solubility is overcoated with a layer containing particles of screen structure material. The retained film regions and the overcoating thereon are removed leaving the screen structure adherent in the areas of greater solubility. By including a diol ether or diol alkane in the film, the exposure time may be shortened significantly without substantial loss of adherence.

9 Claims, No Drawings

REVERSE-PRINTING METHOD FOR PRODUCING CATHODE-RAY-TUBE-SCREEN STRUCTURE

BACKGROUND OF THE INVENTION

This invention relates to a novel method for preparing a screen structure for a cathode-ray tube and particularly, but not exclusively, to a novel method for preparing a light-absorbing matrix for a color-television-picture tube.

Color-television-picture tubes which include a light-absorbing matrix as a structural part of the luminescent viewing screen have been described previously, for example, in U.S. Pat. Nos. 2,842,697 to F. J. Bingley and 3,146,368 to J. P. Fiore et al. These patents describe color-television-picture tubes of the aperture-mask type (also called shadow-mask type) in which a light-absorbing matrix is located on the inner surface of the faceplate of the tube. The matrix has a multiplicity of openings therein, which may be in the shape of dots or lines, with phosphor filling each opening in the matrix.

A reverse-printing method for preparing a light-absorbing matrix for a cathode-ray tube is described in U.S. Pat. No. 3,358,310 issued Jan. 26, 1971 to E. E. Mayaud. In a preferred embodiment of that method, the inner surface of the faceplate of a cathode-ray tube is coated with a film of clear water-based photosensitive material, typically a dichromate-sensitized polyvinyl alcohol. A light image is projected on the film to insolubilize selected regions of the film. The film is flushed with water to remove the still-soluble regions of the film while retaining the insolubilized regions in place. Then, the developed film is overcoated with a layer containing particles of screen structure material, such as graphite. Finally, the retained film regions are removed together with the overlying overcoating, while retaining those portions of the overcoating in the regions previously occupied by removed still-soluble portions of the film. Such a process produces satisfactory screen structures, although further improvements in the process are desirable, for example, by providing shorter exposure times for the film and better definition of the structure.

SUMMARY OF THE INVENTION

In the novel process, a support surface is coated with a film of a photosensitive polymeric material containing about 5 to 80 weight percent of at least one member of the group consisting of diol alkanes having the molecular formula

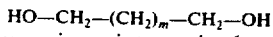

where $m$ is an integer in the range of 2 to 5 and diol ethers having the molecular formula

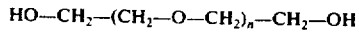

where $n$ is an integer in the range of 1 to 5. The film is then exposed and developed to produce a polymeric image; the image is overcoated with a composition containing particles of light-absorbing or other screen-structure material; and the polymeric image and overlying coating are removed as described in the above-identified patent. The process may be used to fabricate a light-absorbing matrix, or a phosphor pattern, or other screen structure.

By including at least one member of the diol group described above, the exposure time may be shortened to as little as 35 percent of the exposure required for similar films which do not include such member. The presence of a diol ether or alkane in the film does not cause light scattering or other optical effects which may be undesirable during the exposure step. Also, the formulations for preparing the film are stable chemically and exhibit good shelf life and pot life.

DESCRIPTION OF THE PREFERRED EMBODIMENTS

Generally, the details of the novel method are similar to those of the method described in U.S. Pat. No. 3,558,310, except for the film formulation. Subsequent improvements, modifications and alternatives, such as the use of light-scattering particles in the film described in U.S. Pat. No. 3,623,867 issued Nov. 30, 1971; the limpstream-coating technique described in U.S. Pat. No. 3,652,323 issued Mar. 28, 1972; and the print-down by under-exposure technique described in U.S. Pat. No. 3,788,846 issued Jan. 29, 1974, may also be used. Since these other details are already described in the prior art, a further discussion is unnecessary.

The film consists essentially of at least one diol ether or diol alkane, and a polymeric material whose solubility in a solvent is altered when it is exposed to radiant energy. The preferred polymeric material is polyvinyl alcohol containing an amount (2 to 30 weight percent with respect to the weight of the polyvinyl alcohol) of a photosensitizer, which may be a soluble dichromate, such as sodium dichromate, potassium dichromate or ammonium dichromate. Besides polyvinyl alcohol, other photosensitizable polymeric materials may be used. Some suitable materials are gelatin, albumin, starch, fish glue, gum arabic, polyvinyl pyrrolidone and certain acrylic acid derivatives.

The diol alkanes that can be used have the molecular formula:

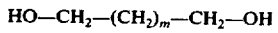

where $m$ is an integer in the range of 2 to 5. The diol ethers that can be used have the molecular formula:

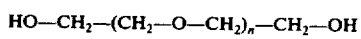

where $n$ is in the range of 1 to 5. These materials, referred to herein as diols, generally have a molecular weight of less than 500. These diols are clear viscous liquids at room temperature. Examples are given in the Table below. The preferred diols are items 9, 13, 17 and 22 of the Table. One or more of the diols is present in the film in concentrations of about 5 to 80 weight percent of the polymeric material. The preferred range is about 20 to 50 weight percent. Too high a concentration of diol is incompatible with the polymeric material and results in a screen structure with poor resolution and/or poor adherence to its support.

The polymeric material, a photosensitizer and a diol ether and/or diol alkane are mixed with water, the mixture is coated on a support surface and then is dried. It is desirable that the film be smooth, unbroken and uncrazed, since this will produce the sharpest, cleanest graphic images. To this end, it is preferred that the polymeric material be film forming either directly upon deposition or during a heating step subsequent to deposition. In many systems, the film-forming temperature can be tailored by adjusting the relative proportions of the ingredients constituting the film. The resistance of the film to the erosive action of the developer may be adjusted, if desired, by including in the film formulation a small amount of a less water-sensitive polymer. For example, where the polymer material is principally polyvinyl alcohol, it is preferred to include a small amount of an acrylic polymer or copolymer. The proportion of acrylic polymer may be up to about 100 percent of the weight of the polyvinyl alcohol present in the film.

An example of the novel method for preparing a light-absorbing matrix on the inner surface of a faceplate of an aperture-mask-type color-television-picture tube will now be described. First, the inner surface of the faceplate for the tube is cleaned in the usual way as with water, ammonium bifluoride, hydrofluoric acid, detergent, caustic, etc. to remove any foreign matter. Then, the surface is coated with a film of photosensitive polymeric material containing an amount of a diol ether or diol alkane (item 13 of the Table). The film may be produced by depositing on the surface of the faceplate a quantity of an aqueous solution containing about:

| Ingredient | Weight Percent |
|---|---|
| Polyvinyl alcohol | 2.88 |
| Acrylic copolymer, such as Rhoplex AC73 marketed by Rohm & Haas Chemical Co., Philadelphia, Pa. | 1.37 |
| Sodium dichromate dihydrate | 0.317 |
| 2,2' ethylene dioxy diethanol, such as the material marketed under the name triethylene glycol by Dow Chemical Company, Midland, Mich. | 0.864 |
| Water | balance to 100 |

The faceplate is rotated and tilted so that the solution spreads evenly over the surface. During the latter steps of rotation, infrared heat is applied so that the water in the solution evaporates and a dry film is formed on the surface.

An aperture mask for the faceplate is positioned above the film and the assembly is placed on a lighthouse, an apparatus designed to expose the film on the faceplate by projection of light through the mask. In this example, the mask has circular apertures with a diameter of about 13 mils and a center-to-center spacing between apertures of about 28 mils near the center of the mask. The film is exposed for about 1.7 minutes to light from a thousand-watt quartz lamp positioned about 14 inches from the aperture mask.

During the exposure, light from the lamp is passed through a light pipe or collimator and projected through the mask causing rays of light to pass through the apertures of the mask and strike upon the film. The irradiated regions of the film harden; that is, become insoluble in water. There is a slight enlargement of the exposed areas above the size of the rays (to about 16 mils) and a graded hardening at the margins of the exposed areas. The exposure through the mask is repeated three times, each time with the light incident at a slightly different angle so that the rays harden the film in groups of three or trios, as in the usual shadowmask-screen manufacture. Substantially less exposure time is required with the novel process as compared with the prior process in which no diol ether or diol alkane is present in the film. In some tests, reductions in the exposure time of the order of 65 percent have been achieved.

Following exposure, the assembly is removed from the lighthouse and the mask separated from the faceplate. The exposed coating is subjected to flushing with a forced spray of water for about 30 seconds, after which the faceplate is rinsed with water and dried. At this point in the process, the faceplate surface carries an adherent stencil comprised of open areas and of dots of hardened polymeric film coated on the surface. The stencil is now overcoated with a composition comprised of light-absorbing particles. In this example, the overcoating is produced by applying to the stencil a slurry containing about 5.0 weight percent of colloidal graphite in water and then drying the overcoating as by applying infrared heat for about 1.5 minutes. After cooling, the overcoating is well adhered both to the polymeric dots and to the bare faceplate surface.

Next, a chemically-digestive agent for the polymeric dots is applied to the overcoating. In this example, the digestive agent is an aqueous solution containing about 7 weight percent hydrogen peroxide. This solution may be applied to the overcoating as a wash or as a spray under pressure. The hydrogen peroxide solution penetrates the overcoating and the dots, causing the hardened polyvinyl alcohol of the dots to swell and soften. Subsequent flushing with water removes the softened dots together with the overlying portion of the overcoating, but leaves behind that portion of the overcoating which is adhered directly to the surface of the faceplate. At this point, the faceplate carries a black light-absorbing matrix having a multiplicity of circular holes therethrough about 16 mils in diameter.

The black, light-absorbing matrix is now rinsed with water and dried for about 4 minutes with the aid of infrared heat. Then, the faceplate is processed in the usual way to deposit red-emitting phosphor dots, green-emitting phosphor dots and blue-emitting phosphor dots about 17 mils in diameter over the holes of the matrix which are about 16 mils in diameter by the usual photographic technique using the same aperture mask as the photomaster in the process. The slight enlargement of the phosphor dots over the holes is achieved by the spreading of light during projection which may be enhanced by increasing the photographic exposure time. The completed screen has a matrix with holes therein and phosphor dots substantially concentric therewith. A suitable process for depositing phosphor dots is described in an article entitled, "Color Television Screening by the Slurry Process," by T. A. Saulnier, Jr. in ELECTROCHEMICAL TECHNOLOGY, 4, 27-31 (1966). The phosphor screen is now filmed and aluminized in the usual way to produce a reflective metal layer on top of the phosphor dots and the matrix. Then, the screen is baked and assembled with the aperture mask into a cathode-ray tube.

The following Table is a summary of some experiments to determine the exposure times required to prepare a 70-percent-transmission matrix using a 25-percent-transmission mask with and without various diol ethers and diol alkanes present in the matrix film. The formulation is that shown in the example except for the diol ether or diol alkane indicated in the first column, and the weight percent of the diol present as indicated in the second column. The weight percent indicated in the second column is with respect to the weight of polyvinyl alcohol present. The third and fourth columns give the molecular weights and boiling points of the diol present. The actual exposure time is indicated in the fifth column. The sixth column indicates the percent the actual exposure time is of the control exposure time (4.3 minutes) shown for item 1. Items 2 through 8 include some additives which were used previously in methods for depositing phosphor layers. It will be noted that the diols in this group 2 through 8 make a slight change in the required exposure time and are generally ineffective for making a significant reduction in exposure time. Items 9 through 23 are considered to be quite effective in reducing the exposure time significantly. Items 24 through 27 are considered to be ineffective for reducing exposure time significantly. Items 22 through 27 are Carbowaxes which are marketed by the Union Carbide Co., New York, N. Y. Carbowaxes are diol ethers, which are polymers of ethylene oxide with the generalized formula HO—CH$_2$—(CH$_2$—O—CH$_2$)$_n$—CH$_2$—OH, $n$ representing the average number of oxyethylene groups.

TABLE

| Item | Diol | Weight % Added | Molecular Weight | Boiling Point ° C | Exposure Time (Minutes) | % of Control Exposure |
|---|---|---|---|---|---|---|
| 1 | None (control) | — | | | 4.3 (4.1 to 4.6) | 100 |
| 2 | (1,2 ethane diol (ethylene glycol) | 30 | | | 4.2 | 98 |
| 3 | 1,2 propane diol (propylene glycol) | 30 | 76.1 | 187 | 5.3 | 115 |
| 4 | 2,3 butane diol (pseudobutylane glycol) | 30 | 90.1 | 180 | Washoff | — |
| 5 | 1,3 butane diol ($\beta$-butylene glycol) | 30 | 90.2 | 208 | 3.8 | 88 |
| 6 | 1,2,3 propane triol (glycerol) | 30 | 92.1 | 290 | Washoff | |
| 7 | Same | 10 | | | Washoff | |
| 8 | 1,3 propane diol (trimethylene glycol) | 30 | 76.1 | 214 | 3.9 | 91 |
| 9 | 1,5 pentane diol (pentamethylene glycol) | 30 | 104.4 | 137 – 138 | 2.3 | 53 |
| 10 | Same | 60 | | | 1.8 | 42 |
| 11 | Same | 80 | | | 1.5 | 35 |
| 12 | Same | 100 | | | Washoff | |
| 13 | 2,2' ethylene dioxy diethanol (triethylene glycol) | 30 | 150 | 285 | 2.3 | 53 |
| 14 | Same | 60 | | | 1.7 | 40 |
| 15 | Same | 80 | | | 1.5 | 35 |
| 16 | Same | 100 | | | Washoff | |
| 17 | tetraethylene glycol | 30 | 194 | 314 | 1.6 | 37 |
| 18 | Same | 45 | | | 1.7 | 39 |
| 19 | Same | 60 | | | Washoff | |
| 20 | 2,2' oxydiethanol (diethylene glycol) | 30 | 106.1 | 245 | 1.7 | 39 |
| 21 | Same | 10 | | | 3.5 | 70 |
| 22 | Carbowax (Union Carbide) "200" | 30 | | | 1.5 | 45 |
| 23 | Carbowax (Union Carbide) "300" | 30 | | | 2.3 | 53 |
| 24 | Carbowax (Union Carbide) "400" | 30 | | | 3.7 | 87 |
| 25 | Carbowax (Union Carbide) "600" | 6 | | | 4.0 | 98 |
| 26 | Carbowax (Union Carbide) "1500" | 30 | | | Washoff | |
| 27 | Carbowax (Union Carbide) "1500" | 3 | | | 4.0 | 98 |

I claim:
1. A method for preparing a luminescent-screen structure of a cathode-ray tube, the steps comprising,
  a. coating a support surface with a film of a polymeric material whose solubility is altered when it is exposed to radiant energy, said film containing about 5 to 80 weight percent of at least one member of the group consisting of diol alkanes having the molecular formula

HO—CH$_2$—(CH$_2$)$_m$—CH$_2$—OH where $m$ is an integer in the range of 2 to 5 and diol ethers having the molecular formula HO—CH$_2$—(CH$_2$—O—CH$_2$)$_n$—CH$_2$—OH where $n$ is an integer in the range of 1 to 5,
  b. exposing said film to an image in the form of radiant energy until the solubility of the irradiated regions thereof is selectively altered, thereby producing in said film regions of greater solublity and regions of lesser solubility,
  c. removing those regions of said film with greater solubility thereby baring the areas of the support surface underlying said regions of greater solubility, while retaining those regions of said film of lesser solubility,
  d. coating said bare areas of said support surface and said retained film regions with a composition containing particles of screen-structure material,
  e. and then removing at least a portion of said retained film regions and the overcoating composition thereon, while retaining the overcoating composition coated on said support surface.

2. The method defined in claim 1 wherein said film contains about 20 to 50 weight percent of said at least one member.

3. The method defined in claim 1 wherein said film contains about 20 to 50 weight percent of 2.2' ethylene dioxy diethanol.

4. A method for preparing a luminescent-screen structure of a cathode-ray tube, the steps comprising,
  a. coating a supporting surface with a film of polyvinyl alcohol, a dichromate sensitizer therefor and about 5 to 80 weight percent with respect to the weight of polyvinyl alcohol present of at least one member of the group consisting of diol alkanes having the molecular formula HO—CH$_2$—(CH$_2$)$_m$—CH$_2$—OH where $m$ is an integer in the range of 2 to 5 and diol ethers having the molecular formula HO—CH$_2$—(CH$_2$—O—CH$_2$)$_n$—CH$_2$—OH where $n$ is an integer in the range of 1 to 5,
  b. exposing said film to an image in the form of radiant energy until the solubility of the irradiated regions thereof is selectively altered, thereby producing in said film regions of greater solubility and regions of lesser solubility, c. removing those regions of said film with greater solubility thereby bring the areas of the support surface underlying said regions of greater solubility, while retaining those regions of said film of lesser solubility, d. coating said bare areas of said support surface and said retained film regions witha composition containing particles of screen-structure material, e. and then removing at least a portion of said retained film regions and the overcoating composition thereon, while retaining the overcoating composition coated on said support surface.

5. The method defined in claim 4 wherein said film contains about 20 to 50 weight percent of said at least one member.

6. The method defined in claim 5 wherein said film contains about 20 to 50 weight percent of 2.2' ethylene dioxy diethanol.

7. The method defined in claim 5 wherein said film contains about 20 to 50 weight percent of 1,5 pentane diol.

8. The method defined in claim 5 wherein said film contains about 20 to 50 weight percent of tetraethylene glycol.

9. The method defined in claim 5 wherein said film contains about 20 to 50 weight percent of a diol ether polymer of ethylene oxide.

* * * * *